United States Patent
Kim et al.

(10) Patent No.: US 10,901,002 B2
(45) Date of Patent: Jan. 26, 2021

(54) FUSE DIAGNOSIS DEVICE AND METHOD USING VOLTAGE DISTRIBUTION

(71) Applicant: LG CHEM, LTD., Seoul (KR)

(72) Inventors: Tae Youn Kim, Daejeon (KR); Il Hoon Choi, Daejeon (KR)

(73) Assignee: LG CHEM, LTD., Seoul (KR)

(*) Notice: Subject to any disclaimer, the term of this patent is extended or adjusted under 35 U.S.C. 154(b) by 105 days.

(21) Appl. No.: 16/094,435

(22) PCT Filed: Sep. 20, 2017

(86) PCT No.: PCT/KR2017/010305
§ 371 (c)(1),
(2) Date: Oct. 17, 2018

(87) PCT Pub. No.: WO2018/066839
PCT Pub. Date: Apr. 12, 2018

(65) Prior Publication Data
US 2019/0120878 A1    Apr. 25, 2019

(30) Foreign Application Priority Data
Oct. 5, 2016 (KR) .................. 10-2016-0128488

(51) Int. Cl.
*G01R 1/20* (2006.01)
*G01R 15/04* (2006.01)
(Continued)

(52) U.S. Cl.
CPC .............. *G01R 1/20* (2013.01); *G01R 15/04* (2013.01); *G01R 19/165* (2013.01); *G01R 31/74* (2020.01);
(Continued)

(58) Field of Classification Search
CPC .......... G01R 1/20; G01R 15/00; G01R 15/04; G01R 19/165–16523; G01R 31/50; G01R 31/74; H01H 85/30–306
See application file for complete search history.

(56) References Cited

U.S. PATENT DOCUMENTS

2005/0212527 A1* 9/2005 Wu ..................... G11C 17/16
324/550
2011/0156650 A1 6/2011 Yang et al.
(Continued)

FOREIGN PATENT DOCUMENTS

| JP | 2-41617 A | 2/1990 |
| JP | 2007-244148 A | 9/2007 |
(Continued)

OTHER PUBLICATIONS

International Search Report issued in PCT/KR2017/010305 (PCT/ISA/210), dated Dec. 26, 2017.
(Continued)

*Primary Examiner* — Huy Q Phan
*Assistant Examiner* — David B Frederiksen
(74) *Attorney, Agent, or Firm* — Birch, Stewart, Kolasch & Birch, LLP

(57) ABSTRACT

The present invention relates to fuse diagnosis device and method using voltage distribution, and more particularly, to fuse diagnosis device and method using voltage distribution which connect a resistor unit and a diagnostic resistor to one side of the fuse so as to be connected with the battery in parallel and calculate voltage of a battery applied to the diagnostic resistor by using the voltage distribution to diagnose a state of the fuse, in order to diagnose the states of one or more fuses connected in parallel.

12 Claims, 5 Drawing Sheets

(51) Int. Cl.
   *G01R 19/165*   (2006.01)
   *G01R 31/07*   (2006.01)
   *H01H 85/30*   (2006.01)
   *G01R 31/74*   (2020.01)

(52) U.S. Cl.
   CPC ....... *H01H 85/30* (2013.01); *G01R 19/16542* (2013.01)

(56) References Cited

U.S. PATENT DOCUMENTS

| | | |
|---|---|---|
| 2012/0242290 A1 | 9/2012 | Asakura |
| 2013/0063154 A1 | 3/2013 | Nakajima et al. |
| 2014/0028322 A1 | 1/2014 | Tzivanopoulos |
| 2014/0188315 A1 | 7/2014 | Kang et al. |
| 2016/0037582 A1* | 2/2016 | Novikov ................ G01R 31/42 219/481 |
| 2016/0077146 A1* | 3/2016 | Englekirk .............. G01R 31/74 324/550 |
| 2016/0119976 A1* | 4/2016 | Bach ...................... G01R 19/10 324/713 |
| 2016/0303977 A1* | 10/2016 | Kudo .................... H02J 7/0021 |
| 2017/0023618 A1* | 1/2017 | Douglass ............... G11C 17/16 |

FOREIGN PATENT DOCUMENTS

| | | | |
|---|---|---|---|
| JP | 5500728 B2 | | 5/2014 |
| JP | 2015-154556 A | | 8/2015 |
| JP | 2016-127769 A | | 7/2016 |
| JP | 2016127769 A | * | 7/2016 |
| KR | 20-1998-039461 U | | 9/1998 |
| KR | 10-2003-0081934 A | | 10/2003 |
| KR | 20030081934 A | * | 10/2003 |
| KR | 2007-329405 A | | 12/2007 |
| KR | 10-2008-0082869 A | | 9/2008 |
| KR | 10-2013-0081215 A | | 7/2013 |
| KR | 10-2014-0007180 A | | 1/2014 |
| KR | 20140007180 A | * | 1/2014 |
| KR | 10-1394751 B1 | | 5/2014 |

OTHER PUBLICATIONS

Extended European Search Report, dated Mar. 4, 2019, for European Application No. 17858634.3.

* cited by examiner

[Figure 1]
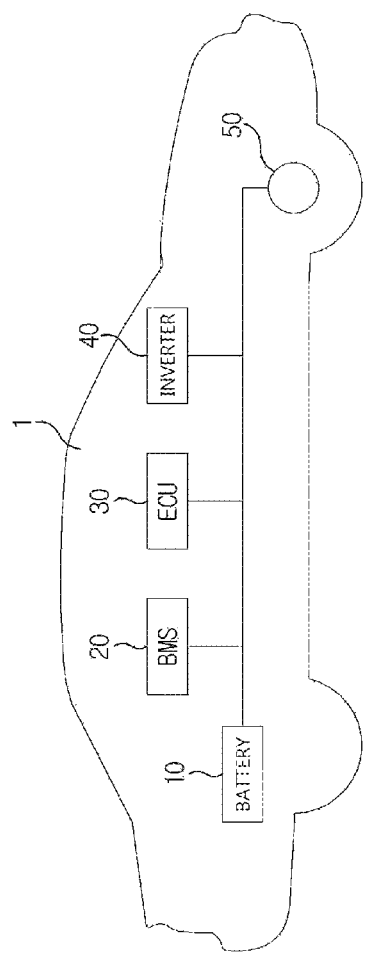

[Figure 2]
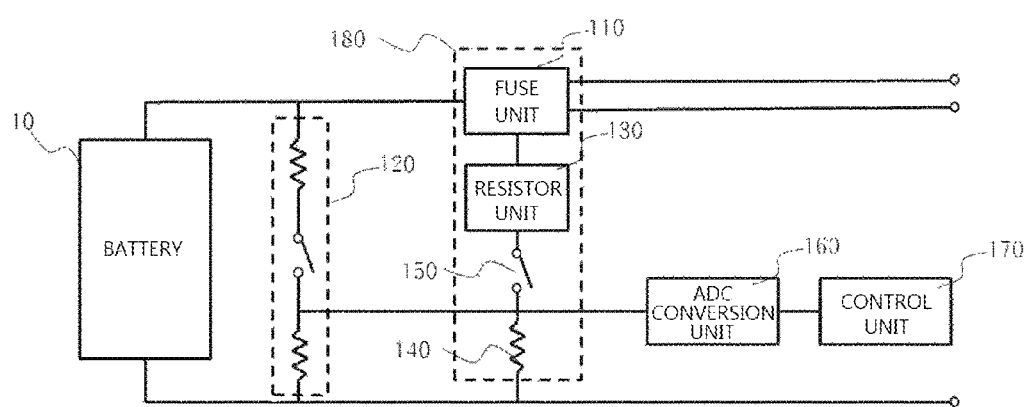

[Figure 3]
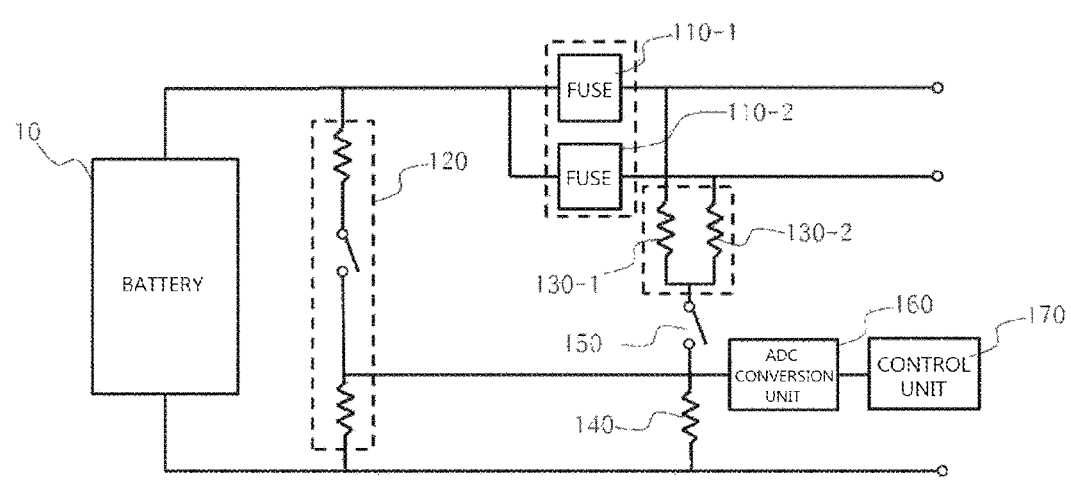

[Figure 4]
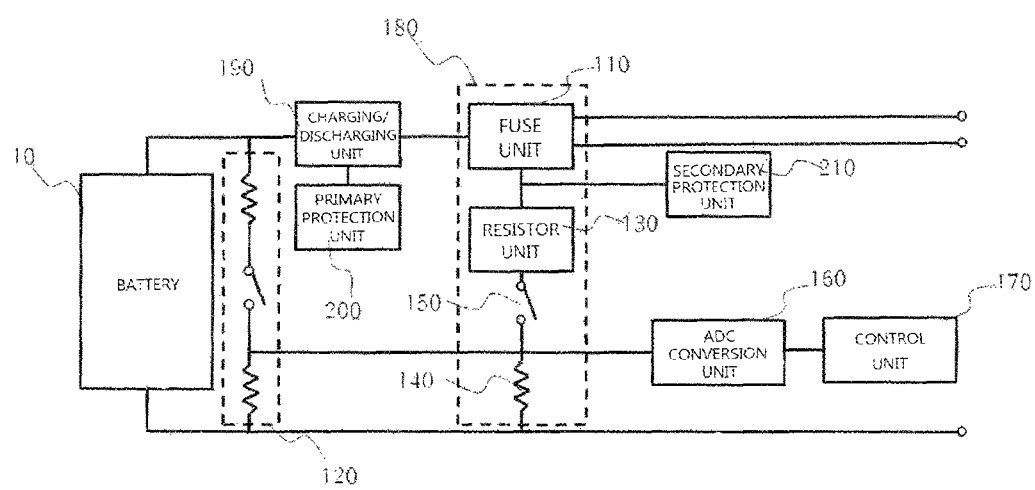

[Figure 5]
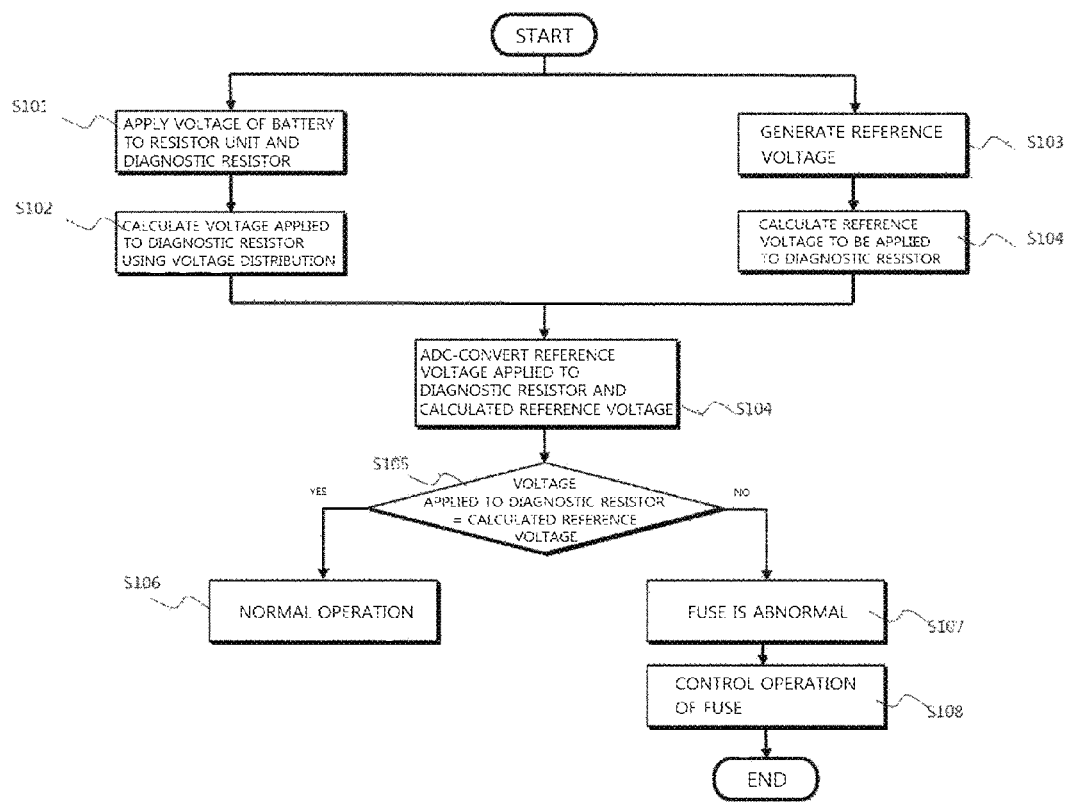

FUSE DIAGNOSIS DEVICE AND METHOD USING VOLTAGE DISTRIBUTION

TECHNICAL FIELD

This application claims priority to and the benefit of Korean Patent Application No. 10-2016-0128488 filed in the Korean Intellectual Property Office on Oct. 5, 2016, the entire contents of which are incorporated herein by reference.

The present invention relates to fuse diagnosis device and method using voltage distribution, and more particularly, to fuse diagnosis device and method using voltage distribution which connect a resistor unit and a diagnostic resistor to one side of the fuse so as to be connected with the battery in parallel and calculate voltage of a battery applied to the diagnostic resistor by using the voltage distribution to diagnose a state of the fuse, in order to diagnose the states of one or more fuses connected in parallel.

BACKGROUND ART

A secondary battery which is high in application easiness according to a product group and has electrical characteristics including high energy density, and the like is universally applied to an electric vehicle (EV) driven by an electric driving source, a hybrid vehicle (HV) or an energy storage system (ESS) or an uninterruptible power supply (UPS) system using a medium/large battery used for a house or an industry as well as a portable device.

The secondary battery has received public attention as a new energy source for promoting eco-friendly performance and energy efficiency in that byproducts are not generated at all according to the use of the energy as well as a primary advantage of dramatically reducing the use of fossil fuels.

When the secondary battery is implemented as a battery of a portable terminal, or the like, not particularly so, but the battery applied to the electric vehicle or an energy storage source is used in a type in which a plurality of unit secondary battery cells is generally aggregated to increase suitability for a high-capacity environment.

When the unit secondary battery cells are aggregated as described above, unit cells may be inflated and broken due to overheating in the case where operation abnormality such as flow of overcurrent, or the like occurs. Therefore, by using a protection element such as a fuse, it is necessary to prevent the unit cell from being broken from the overcurrent and isolate the load from the overcurrent to protect the load.

In the related art, a safety device including the fuse is designed to protect the load from the overcurrent generated in a battery cell and an external short circuit. However, when the fuse does not operate normally, since it is not possible to safely protect the load from the overcurrent and the external short circuit, it was necessary to construct a separate system for diagnosing the state of the fuse or to install a component for diagnosing the fuse in a battery management system (BMS). However, there is a drawback that volumes and prices of a battery pack and the battery management system are increased by providing a separate system and an additional component. Since such an increase in volume and price adversely affects high efficiency and high energy density of the secondary battery, it is necessary to reduce the volume and the price of a fuse diagnosing apparatus.

DETAILED DESCRIPTION OF THE INVENTION

Technical Problem

An object of the present invention is to provide fuse diagnosis device and method using voltage distribution which connect one or more resistors and diagnostic resistors to one side of one or more fuses so as to be connected in parallel with the battery to diagnose states of one or more fuses connected to one or more terminals connected in parallel, respectively and calculate battery voltage applied to the diagnostic resistor using the voltage distribution to thereby diagnose the state of the fuse.

Further, another object of the present invention is to provide fuse diagnosis device and method using voltage distribution, which receive voltage distributed by using one ADC converter positioned outside and diagnose the states of one or more fuses based on the received voltage to thereby reduce a volume and a price.

Technical Solution

According to an embodiment of the present invention, a fuse diagnosis device using voltage distribution may include: a fuse unit connected with a battery and one or more terminals to block overvoltage and overcurrent generated from the battery; a diagnostic resistor diagnosing a state of the fuse unit; a resistor unit of which one side is connected with the fuse unit and the other side is connected with the diagnostic resistor; and a control unit calculating voltage applied to the diagnostic resistor from the voltage of the battery applied to the resistor unit and the diagnostic resistor by using the voltage distribution and diagnosing the state of the fuse unit based on the calculated voltage.

In the fuse unit, one or more fuses connected in parallel may be connected to one or more terminals, respectively and in the resistor unit, the sides of one or more resistors may be connected with one or more fuses, respectively and magnitudes of one or more resistors may be different from each other.

The fuse diagnosis device using voltage distribution may further include an ADC conversion unit converting the voltage of the battery applied to the diagnostic resistor into a digital signal and the control unit may diagnose the state of the fuse unit based on the converted digital signal.

The fuse diagnosis device using voltage distribution may further include a reference voltage generating unit generating reference voltage for diagnosing the state of the battery and the control unit may calculate the voltage to be applied to the diagnostic resistor based on the reference voltage and compare the voltage applied to the diagnostic resistor and the calculated voltage to diagnose the state of the fuse unit.

The fuse diagnosis device using voltage distribution may further include a switch unit located between the resistor unit and the diagnostic resistor and connecting and disconnecting the resistor unit and the diagnostic resistor and the control unit may apply the voltage of the battery to the diagnostic resistor by controlling opening/closing of the switch unit and diagnose the state of the fuse unit based on the applied voltage.

The fuse unit, the resistor unit, and the diagnostic resistor may be configured by one fuse diagnosing unit and the control unit may be located outside the fuse diagnosing unit.

The fuse diagnosis device using voltage distribution may further include: a charging/discharging unit charging and discharging the battery in connection with one or more terminals; a primary protection unit controlling the charging/discharging unit based on a charging potential of the battery; and a secondary protection unit operating the fuse unit based on a charging state of the battery and parts other than the battery may be manufactured by a printed circuit board and thereafter, may be coupled with the battery and when the parts are manufactured by the printed circuit board, the fuse unit and the secondary protection unit may be formed to be spatially isolated from other parts.

According to another embodiment of the present invention, a fuse diagnosis method using voltage distribution may include: blocking, by a fuse unit, overvoltage and overcurrent generated from a battery in connection with the battery and one or more terminals; diagnosing a state of the fuse unit through a diagnostic resistor; connecting one side with the fuse unit and the other side with the diagnostic resistor through a resistor unit; and calculating, by a control unit, voltage applied to the diagnostic resistor from the voltage of the battery applied to the resistor unit and the diagnostic resistor by using the voltage distribution and diagnosing the state of the fuse unit based on the calculated voltage.

The blocking may include connecting one or more fuses connected in parallel to one or more terminals, respectively, and connecting sides of one or more resistors having different magnitudes with one or more fuses, respectively.

The fuse diagnosis method using voltage distribution may further include converting, by an ADC conversion unit, the voltage of the battery applied to the diagnostic resistor into a digital signal and the diagnosing may include diagnosing the state of the fuse unit based on the converted digital signal.

The fuse diagnosis method using voltage distribution may further include generating reference voltage for diagnosing the state of the battery and the diagnosing may further include calculating the voltage to be applied to the diagnostic resistor based on the reference voltage and comparing the voltage applied to the diagnostic resistor and the calculated voltage to diagnose the state of the fuse unit.

The fuse diagnosis method using voltage distribution may further include being, by a switch unit, located between the resistor unit and the diagnostic resistor and connecting and disconnecting the resistor unit and the diagnostic resistor and the diagnosing may further include applying the voltage of the battery to the diagnostic resistor by controlling opening/closing of the switch unit and diagnosing the state of the fuse unit based on the applied voltage.

The fuse diagnosis method using voltage distribution may further include: configuring the fuse unit, the resistor unit, and the diagnostic resistor by one fuse diagnosing unit; and locating the control unit outside the fuse diagnosing unit.

The fuse diagnosis method using voltage distribution may further include: charging and discharging, by a charging/discharging unit, the battery in connection with one or more terminals; controlling, by a primary protection unit, the charging/discharging unit based on a charging potential of the battery; operating, by a secondary protection unit, the fuse unit based on a charging state of the battery; and manufacturing parts other than the battery to a printed circuit board and thereafter, coupling the manufactured parts with the battery and when the parts are manufactured by the printed circuit board, spatially isolating the fuse unit and the secondary protection unit from other parts.

Advantageous Effects

According to an aspect of the present invention, fuse diagnosis device and method using voltage distribution can be provided, which connect one or more resistors and diagnostic resistors to one side of one or more fuses so as to be connected in parallel with the battery to diagnose states of one or more fuses connected to one or more terminals connected in parallel, respectively and calculate battery voltage applied to the diagnostic resistor using the voltage distribution to thereby diagnose the state of the fuse.

Further, fuse diagnosis device and method using voltage distribution can be provided, which receive voltage distributed by using one ADC converter positioned outside and diagnose the states of one or more fuses based on the received voltage to thereby reduce a volume and a price.

BRIEF DESCRIPTION OF DRAWINGS

FIG. 1 is a diagram schematically illustrating an electric vehicle to which a fuse diagnosis device using voltage distribution may be applied according to an embodiment of the present invention.

FIGS. 2 and 3 are diagrams schematically illustrating a fuse diagnosis device using voltage distribution according to an embodiment of the present invention.

FIG. 4 is a diagram schematically illustrating a fuse diagnosis device 100 using voltage distribution according to another embodiment of the present invention.

FIG. 5 is a flowchart for describing a fuse diagnosis method using voltage distribution according to an embodiment of the present invention.

BEST MODE

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

FIG. 1 is a diagram schematically illustrating an electric vehicle to which a fuse diagnosis device using voltage distribution may be applied according to an embodiment of the present invention.

In FIG. 1, an example in which the fuse diagnosis device using voltage distribution according to the embodiment of the present invention is applied to an electric vehicle 1 is illustrated, but the fuse diagnosis device using voltage distribution according to the embodiment of the present invention may be applied to all technical fields to which a secondary battery such as a home or industrial energy storage system (ESS), or an uninterruptible power supply (UPS) system may be applied in addition to the electric vehicle.

The electric vehicle 1 may be configured to include a battery 10, a battery management system (BMS) 20, an electronic control unit (ECU) 30, an inverter 40, and a motor 50.

The battery 10 is an electric energy source that drives the electric vehicle 1 by providing driving force to the motor 50. The battery 10 may be charged or discharged by the inverter 40 by driving the motor 50 and/or an internal combustion engine (not illustrated).

Herein, a type of battery 10 is not particularly limited and the battery 10 may be constituted by, for example, a lithium ion battery, a lithium polymer battery, a nickel cadmium battery, a nickel hydrogen battery, a nickel zinc battery, and the like.

Further, the battery 10 is formed by a battery pack in which a plurality of battery cells is connected in series and/or in parallel. In addition, the battery 10 may include one or more battery packs.

The BMS 20 estimates the state of the battery 10 and manages the battery 10 by using estimated state information. For example, the BMS 20 estimates and manages state information of the battery 10, which includes a state of charging (SOC), a state of health (SOH), a maximum input/output power allowance amount, output voltage, and the like of the battery 10. In addition, the BMS 20 may control charging or discharging of the battery 10 by using the state information and furthermore, also estimate a replacement time of the battery 10.

The BMS 20 includes the fuse diagnosis device 100 using voltage distribution according to the embodiment of the present invention to be described below or is connected to the fuse diagnosis device 100 using voltage distribution to operate. The BMS 20 connects a fuse unit 110 and a resistor unit 130, and a diagnostic resistor 140 so as to be connected in parallel with the battery 10 and compares reference voltage with voltage applied to the diagnostic resistor 140 to diagnose the fuse unit 110.

The ECU 30 is an electronic control device that controls the state of the electric vehicle 1. For example, the ECU 30 determines a torque degree based on information such as an accelerator, a brake, a speed, and the like and controls an output of the motor 50 according to the torque information.

Further, the ECU 30 transmits a control signal to the inverter 40 so that the battery 10 is charged or discharged by the BMS 20.

The inverter 40 allows the battery 10 to be charged or discharged based on the control signal of the ECU 30.

The motor 50 drives the electric vehicle 1 based on control information (e.g., torque information) transferred from the ECU 30 by using electric energy of the battery 10.

Hereinafter, the fuse diagnosis device using voltage distribution according to the embodiment of the present invention will be described with reference to FIGS. 2 and 3. FIGS. 2 and 3 are diagrams schematically illustrating a fuse diagnosis device using voltage distribution according to the embodiment of the present invention.

Referring to FIGS. 2 and 3, the fuse diagnosis device 100 using voltage distribution according to the embodiment of the present invention may include the fuse unit 110, a reference voltage generating unit 120, the resistor unit 130, the diagnostic resistor 140, a switch unit 150, an ADC conversion unit 160, and a control unit 170.

The fuse diagnosis device 100 using voltage distribution illustrated in FIGS. 2 and 3 follows the embodiment and components thereof are not limited to the embodiment illustrated in FIGS. 2 and 3 and as necessary, the components may be added, modified, or deleted.

The fuse unit 110 is connected to the battery 10 and one or more terminals to block overvoltage and overcurrent generated from the battery. To this end, the fuse unit 110 may include one or more fuses. One or more fuses may be connected in parallel and connected to one or more terminals, respectively. For example, when two terminals are constituted in the battery 10, two terminals and two fuses may be connected by placing the fuse between the battery 10 and each terminal. When the overvoltage and the overcurrent occur in the battery 10, the fuses connected to the respective two terminals respectively operate individually, thereby protecting a load from the overvoltage and the overcurrent.

The reference voltage generating unit 120 may generate reference voltage for diagnosing the state of the battery 10. Herein, the reference voltage may be a voltage value measured at the time when the battery 10 operates normally and may be a reference value for diagnosing the state of the battery 10 or diagnosing the state of the fuse unit 110 through the control unit 170 to be described below. For example, the reference voltage may be 400 V, and when the voltage measured by the battery 10 is reference DC voltage of 400 V or more, the state of the battery 10 may be diagnosed as an abnormal state through the control unit 170 to be described below. Further, it is possible to calculate the reference voltage to be applied to the diagnostic resistor 140 to be described later through the reference voltage of 400 V and to compare the reference voltage to be applied to the diagnostic resistor 140 and the resistance applied to the diagnostic resistor 140 to diagnose the state of the fuse unit 110.

The reference voltage generating unit 120 may include one or more resistors and may generate the reference voltage using a voltage distribution law. As an example, when the control unit 170 to be described below is a micro controller unit (MCU), the MCU may support a voltage value of a magnitude of 4 to 5 V. However, since the battery 10 has relatively high voltage with a magnitude of 400 to 500V, it is difficult to be immediately applied with the power output from the battery 10 and use the applied power. Therefore, by reducing the voltage applied from the battery 10 using a voltage distribution law, the voltage may be adjusted to a voltage magnitude of a degree supported by the MCU. For example, the reference voltage generating unit 120 may include a resistor having a magnitude of 1 M$\Omega$ and 10 k$\Omega$. When the voltage of the battery 10 is 400 V, the voltage of 400 V is applied to 1 M$\Omega$ and 10 k$\Omega$ and the voltage of 400 V becomes (400V*10 k$\Omega$)/1010 k$\Omega$ according to the voltage distribution law, and as a result, the reference voltage of 3.96 V is generated.

Additionally, the reference voltage generating unit 120 may include one or more switches between one or more resistors. The switch is operated only when the reference voltage is intended to be generated through one or more switches through one or more switches to prevent unnecessary power loss and leakage current.

One side of the resistor unit 130 may be connected to the fuse unit 110 and the other side thereof may be connected to the diagnostic resistor 140 to be described below. The resistor unit 130 may include one or more resistors to be connected to one or more fuses, respectively. Further, one or more resistors may be connected in parallel for connection to one or more fuses connected in parallel, respectively.

One or more resistors included in the resistor unit 130 may be different in size, therefore, when an abnormality occurs in the states of one or more fuses, the control unit 170 to be described later may check which fuse is abnormal.

The diagnostic resistor 140 may be connected to the resistor unit 130 in order to diagnose the state of the fuse unit 110. Herein, the resistor unit 130 and the diagnostic resistor 140 are resistors used for the voltage distribution and the magnitudes of one or more resistors included in the resistor unit 130 may be larger than the magnitude of the diagnostic resistor 140. As an example, the magnitude of the resistor included in the resistor unit 130 may be 2 MΩ and 3 MΩ and the magnitude of the diagnostic resistor 140 may be 10 kΩ.

The switch unit 150 may be positioned between the resistor unit 130 and the diagnostic resistor 140 and may connect or disconnect the resistor unit 130 and the diagnostic resistor 140. The switch unit 150 may include one or more switching elements. The switch unit 150 performs an on/off operation under the control of the control unit 170 described below to connect or disconnect the resistor unit 130 and the diagnostic resistor 140. Only when the state of the fuse unit 110 is intended to be diagnosed through the connection or disconnection, the resistor unit 130 and the diagnostic resistor 140 are connected by controlling the operation of the switch unit 150 to prevent unnecessary power loss and leakage current from occurring.

The ADC conversion unit 160 may convert the voltage of the battery 10 applied to the diagnostic resistor 140 into a digital signal. The ADC conversion unit 160 receives the reference voltage generated from the reference voltage generating unit 120 and the voltage of the battery 10 measured from the diagnostic resistor 140 as an analog signal and converts the analog signal into a digital signal and outputs the digital signal to the control unit 170 described below, so that the control unit 170 described below may diagnose the state of the fuse unit 110 based on the digital signal.

The control unit 170 may calculate the voltage applied to the diagnostic resistor 140 from the voltage of the battery 10 applied to the resistor unit 130 and the diagnostic resistor 140 by using the voltage distribution. Further, the control unit 170 may diagnose the state of the fuse based on the calculated voltage.

Further, the control unit 170 may calculate the voltage to be applied to the diagnostic resistor 140 based on the reference voltage generated by the reference voltage generating unit 120. In addition, the state of the fuse unit 110 may be diagnosed by comparing the voltage applied to the diagnostic resistor 140 with the calculated reference voltage.

Referring to Table 1 and FIG. 3, for example, when the reference voltage of the battery 10 is 400 V, while a first fuse 110-1 and a second fuse 110-2 are connected in parallel, a first resistor 130-1 and a second resistor 130-2 may be connected, respectively. The magnitudes of the first and second resistors 130-1 and 130-2 may be 2 MΩ and 3 MΩ, respectively and the actual magnitudes may be 1.996 MΩ and 2.994 MΩ. Further, the magnitude of the diagnostic resistor 140 may be 10 kΩ. The control unit 170 may calculate the voltage to be applied to the diagnostic resistor 140 whenever the voltage of the battery 10 is 100 to 500 V based on the reference voltage received from the reference voltage generating unit 120. When the voltage of the battery 10 is 400 V and the first fuse 110-1 and the second fuse 110-2 are not abnormal as shown in Table 1, the voltage value measured at the diagnostic resistor 140 may become 3.312 V. However, when the second fuse 110-2 is abnormal and the second fuse 110-2 is thus turned off, the second resistor 130-2 connected to the second fuse 110-2 is also turned off and the voltage of the battery 10 is applied only to the first fuse 110-1 and the first resistor 130-1, and as a result, the voltage value applied to the diagnostic resistor 140 may become 1.987 V. Further, when the first fuse 110-1 is turned off, the first resistor 130-1 connected to the first fuse 110-1 is also turned off and the voltage of the battery 10 is applied only to the second fuse 110-2 and the second resistor 130-2, and as a result, the voltage value applied to the diagnostic resistor 140 may become 1.332 V. Therefore, when the voltage applied to the diagnostic resistor 140 is 3.312 V, the control unit 170 may diagnose that the fuse unit 110 is in a normal state and when the voltage applied to the diagnostic resistor 140 is 1.987 V, the control unit 170 may diagnose that the state of the second fuse 110-2 is abnormal.

TABLE 1

| Reference voltage | First fuse | Second fuse | First resistor | Second resistor | Diagnostic resistor | Predicted voltage |
|---|---|---|---|---|---|---|
| 200 | 200 | 200 | 1.996 MΩ | 2.994 MΩ | 10 KΩ | 1.656 |
| 400 | 400 | 400 | 1.996 MΩ | 2.994 MΩ | 10 KΩ | 3.312 |
| 400 | 400 | −400 | 1.996 MΩ | 2.994 MΩ | 10 KΩ | 0.662 |
| 400 | 400 | −200 | 1.996 MΩ | 2.994 MΩ | 10 KΩ | 1.325 |
| 400 | 400 | 0 | 1.996 MΩ | 2.994 MΩ | 10 KΩ | 1.987 |
| 400 | 400 | 200 | 1.996 MΩ | 2.994 MΩ | 10 KΩ | 2.650 |
| 400 | 0 | 400 | 1.996 MΩ | 2.994 MΩ | 10 KΩ | 1.332 |

The fuse diagnosis device 100 using voltage distribution according to the embodiment of the present invention may include the fuse unit 110, the resistor unit 130, and the diagnostic resistor 140 as one fuse diagnosis unit 180 and the control unit 170 may be located outside the fuse diagnosis unit 180. As an example, when the state of the fuse is intended to be diagnosed with respect to a plurality of fuses connected in series, the resistor unit 130 and the diagnostic resistor 140 are connected to the plurality of fuses, respectively and a plurality of voltage applied to the diagnostic resistor 140 is provided to the ADC conversion unit 160 and the control unit 170 located outside to diagnose the states of the plurality of fuses to one ADC conversion unit 160 and the control unit 170 positioned outside.

In another embodiment, the fuse unit 110 may be used while being replaced with other components to be diagnosed. As an example, when the state of a relay is intended to be diagnosed, the resistor unit 130 and the diagnostic resistor 140 are connected to the relay and the magnitude of the voltage applied to the diagnostic resistor 140 is measured by such a method to diagnose the state of the relay. Further, such a method may be used even when the state of the terminal that connects and disconnects the battery and the load is intended to be measured. Therefore, the states of a plurality of components located inside the battery pack 10 or the BMS may be measured by one external ADC conversion unit 160 and the control unit 170.

The states of the plurality of components located inside the battery pack 10 or the BMS, such as the fuse unit 110, the relay, and the terminal are measured by one external ADC conversion unit 160 and the control unit 170 and an additional component for diagnosis is not used or a separate system is not constructed to reduce the volumes and the prices of the battery pack 10 and the BMS.

FIG. 4 is a diagram schematically illustrating a fuse diagnosis device 100 using voltage distribution according to another embodiment of the present invention.

Referring to FIG. 4, the fuse diagnosis device 100 using voltage distribution according to another embodiment of the present invention may include a charging/discharging unit 190, a primary protection unit 200, and a secondary protection unit 210.

The charging/discharging unit 190 is connected to one or more terminals to charge and discharge the battery 10.

The primary protection unit 200 may control the charging/discharging unit 190 based on a charging potential of the battery 10. As an example, when the charging potential of the battery 10 is equal to or higher than a reference potential, the primary protection unit 200 may prevent the charging potential of the battery 10 from being increased by off-controlling the operation of the charging/discharging unit.

The secondary protection unit 210 may control the fuse unit 110 based on a charging state of the battery 10. As an example, when the charging state of the battery 10 is an overcharging state, the secondary protection unit 210 controls the fuse unit 110 to normally operate, and as a result, the battery 10 which is overcharged is discharged, thereby lowering the charging potential.

Herein, the secondary protection unit 210 and the fuse unit 110 may be formed to be spatially independent from other components.

In general, parts other than the battery 10 may be coupled with the battery 10 after being manufactured on a printed circuit board. In this case, when the overcurrent and overvoltage of the battery 10 are generated or a temperature becomes high, the fuse unit 110 may be affected. Due to such an influence, one or more fuses included in the fuse unit 110 may not operate normally and the load may not be safely protected from the battery 10 in an abnormal state. Therefore, the fuse unit 110 and the secondary protection unit 210 for controlling the fuse unit 110 are spatially separated and isolated from other components not to be influenced by the battery 10 in the abnormal state. In addition, it is possible to safely protect the load from the battery 10 in the abnormal state on the basis of the spatial isolation.

Hereinafter, a fuse diagnosis method (S100) using voltage distribution according to an embodiment of the present invention will be described with reference to FIG. 5.

FIG. 5 is a flowchart for describing a fuse diagnosis method using voltage distribution according to an embodiment of the present invention.

Referring to FIG. 5, when disclosed is the fuse diagnosis method (S110) by using voltage distribution according to the embodiment of the present invention, the voltage of the battery is applied to the resistor unit and the diagnostic resistor connected with the fuse to be diagnosed (S101). The voltage applied to the diagnostic resistor is calculated based on the voltage of the battery applied in step S101 and the voltage distribution law (S102). In this case, the reference voltage generating unit measures the reference voltage of the battery and calculates the voltage to be applied to the diagnostic resistor based on the measured reference voltage to set the reference voltage to be applied to the diagnostic resistor (S103 and S104). The voltage applied to the diagnostic resistor calculated in step S102 and the reference voltage calculated in step S104 are converted into the digital signals by the ADC conversion unit (S104). The digital signals converted in step S104 are provided to the control unit and the control unit compares the voltage applied to the diagnostic resistor and the reference voltage (S105). When the voltage applied to the diagnostic resistor and the calculated reference voltage in step S105 are the same or fall within a tolerance range, the state of the fuse is diagnosed as the normal state and a normal operation is performed (S106). On the contrary, when the voltage applied to the diagnostic resistor and the calculated reference voltage are not equal to each other or do not fall within the tolerance range, the state of the fuse is diagnosed as the abnormal state and the abnormality is diagnosed (S107). If one or more fuses are diagnosed, resistors having different magnitudes are used to know which fuse is abnormal in step S107, and as a result, the fuse which is abnormal is controlled (S108). In another embodiment, a result for the fuse which is abnormal is output to the outside to allow a user to know the result.

The aforementioned fuse diagnosis method using voltage distribution has been described with reference to the flowcharts presented in the drawings. The method has been shown and described by a series of blocks for easy description, but it is to be understood that the present invention is not limited to the order of the blocks, and that some blocks may be referred to in different orders from and concurrently with other blocks as shown and described in the present specification, and various other branches, flow paths, and orders of blocks may be implemented to achieve the same or similar result. In addition, all illustrated blocks may not be required for the implementation of the method described in the present specification.

Hereinabove, a specific embodiment of the present invention has been illustrated and described, but the technical spirit of the present invention is not limited to the accompanying drawings and the described contents and it is apparent to those skilled in the art that various modifications of the present invention can be made within the scope without departing from the spirit of the present invention and it will be regarded that the modifications are included in the claims of the present invention without departing from the spirit of the present invention.

The invention claimed is:

1. A fuse diagnosis apparatus using voltage distribution, the apparatus comprising:
    a fuse unit connected with a battery and one or more terminals to block overvoltage and overcurrent generated from the battery;
    a diagnostic resistor diagnosing a state of the fuse unit;
    a resistor unit of which one side is connected with the fuse unit and the other side is connected with the diagnostic resistor;
    a control unit calculating voltage applied to the diagnostic resistor from the voltage of the battery applied to the resistor unit and the diagnostic resistor by using the voltage distribution and diagnosing the state of the fuse unit based on the calculated voltage; and
    a reference voltage generating unit generating a reference voltage for diagnosing the state of the fuse unit by reducing the voltage applied from the battery,
    wherein the reference voltage generating unit is parallel to the diagnostic resistor and is parallel to the resistor unit,
    wherein the reference voltage generating unit includes a resistor and a switch, and
    wherein the control unit calculates the voltage to be applied to the diagnostic resistor based on the reference voltage and compares the voltage applied to the diagnostic resistor and the calculated voltage to diagnose the state of the fuse unit.

2. The apparatus of claim 1, wherein in the fuse unit, one or more fuses connected in parallel are connected to one or more terminals, respectively, and in the resistor unit, the sides of one or more resistors are connected with one or more fuses, respectively and magnitudes of one or more resistors are different from each other.

3. The apparatus of claim 1, further comprising:
an ADC conversion unit converting the voltage of the battery applied to the diagnostic resistor into a digital signal,
wherein the control unit diagnoses the state of the fuse unit based on the converted digital signal.

4. The apparatus of claim 1, further comprising:
a switch unit located between the resistor unit and the diagnostic resistor and connecting and disconnecting the resistor unit and the diagnostic resistor,
wherein the control unit applies the voltage of the battery to the diagnostic resistor by controlling opening/closing of the switch unit and diagnoses the state of the fuse unit based on the applied voltage.

5. The apparatus of claim 1, wherein the fuse unit, the resistor unit, and the diagnostic resistor are configured by one fuse diagnosing unit and the control unit is located outside the fuse diagnosing unit.

6. The apparatus of claim 1, further comprising:
a charging/discharging unit charging and discharging the battery in connection with one or more terminals;
a primary protection unit controlling the charging/discharging unit based on a charging potential of the battery; and
a secondary protection unit operating the fuse unit based on a charging state of the battery,
wherein parts other than the battery are manufactured by a printed circuit board and thereafter, are coupled with the battery and when the parts are manufactured by the printed circuit board, the fuse unit and the secondary protection unit are formed to be spatially isolated from other parts.

7. A fuse diagnosis method using voltage distribution, the method comprising:
blocking, by a fuse unit, overvoltage and overcurrent generated from a battery in connection with the battery and one or more terminals;
generating a reference voltage through a reference voltage generating unit by reducing voltage applied from the battery;
diagnosing a state of the fuse unit through a diagnostic resistor and during the generating the reference voltage;
connecting one side with the fuse unit and the other side with the diagnostic resistor through a resistor unit; and
calculating, by a control unit, voltage applied to the diagnostic resistor from the voltage of the battery applied to the resistor unit and the diagnostic resistor by using the voltage distribution and diagnosing the state of the fuse unit based on the calculated voltage,
wherein the reference voltage generating unit is parallel to the diagnostic resistor and is parallel to the resistor unit,
wherein the reference voltage generating unit includes a resistor and a switch, and
wherein the diagnosing further includes calculating the voltage to be applied to the diagnostic resistor based on the reference voltage and comparing the voltage applied to the diagnostic resistor and the calculated voltage to diagnose the state of the fuse unit.

8. The method of claim 7, wherein the blocking includes connecting one or more fuses connected in parallel to one or more terminals, respectively, and
connecting sides of one or more resistors having different magnitudes with one or more fuses, respectively.

9. The method of claim 7, further comprising:
converting, by an ADC conversion unit, the voltage of the battery applied to the diagnostic resistor into a digital signal,
wherein the diagnosing includes diagnosing the state of the fuse unit based on the converted digital signal.

10. The method of claim 7, further comprising:
providing a switch unit, located between the resistor unit and the diagnostic resistor; and
connecting and disconnecting, by the switch unit, the resistor unit and the diagnostic resistor,
wherein the diagnosing further includes applying the voltage of the battery to the diagnostic resistor by controlling opening/closing of the switch unit and diagnosing the state of the fuse unit based on the applied voltage.

11. The method of claim 7, further comprising:
configuring the fuse unit, the resistor unit, and the diagnostic resistor by one fuse diagnosing unit; and
locating the control unit outside the fuse diagnosing unit.

12. The method of claim 7, further comprising:
charging and discharging, by a charging/discharging unit, the battery in connection with one or more terminals;
controlling, by a primary protection unit, the charging/discharging unit based on a charging potential of the battery;
operating, by a secondary protection unit, the fuse unit based on a charging state of the battery; and
manufacturing parts other than the battery to a printed circuit board and thereafter, coupling the manufactured parts with the battery and when the parts are manufactured by the printed circuit board, spatially isolating the fuse unit and the secondary protection unit from other parts.

* * * * *